United States Patent [19]
Akram et al.

[11] Patent Number: 5,807,762
[45] Date of Patent: Sep. 15, 1998

[54] MULTI-CHIP MODULE SYSTEM AND METHOD OF FABRICATION

[75] Inventors: Salman Akram; David R. Hembree; James M. Wark, all of Boise, Id.

[73] Assignee: Micron Technology, Inc., Boise, Id.

[21] Appl. No.: 614,301

[22] Filed: Mar. 12, 1996

[51] Int. Cl.⁶ .............................. H01L 21/66; H01L 21/44
[52] U.S. Cl. .............................. 438/15; 438/106; 438/112
[58] Field of Search ...................... 438/106, 107, 438/109, 112, 113, 114, 15

[56] References Cited

U.S. PATENT DOCUMENTS

| | | |
|---|---|---|
| 4,992,850 | 2/1991 | Corbett et al. . |
| 5,107,328 | 4/1992 | Kinsman . |
| 5,137,836 | 8/1992 | Lam . |
| 5,155,067 | 10/1992 | Wood et al. . |
| 5,239,747 | 8/1993 | Ewers . |
| 5,378,981 | 1/1995 | Higgins, III . |
| 5,424,652 | 6/1995 | Hembree et al. . |
| 5,448,165 | 9/1995 | Hodge et al. . |
| 5,461,544 | 10/1995 | Ewers . |
| 5,468,655 | 11/1995 | Greer . |
| 5,475,317 | 12/1995 | Smith . |
| 5,549,716 | 8/1996 | Takahashi et al. ......................... 438/15 |
| 5,581,510 | 12/1996 | Furusho et al. ............................ 438/15 |
| 5,610,081 | 3/1997 | Ping et al. ................................. 438/15 |

*Primary Examiner*—John Niebling
*Assistant Examiner*—Michael S. Lebentritt
*Attorney, Agent, or Firm*—Trask, Britt & Rossa

[57] ABSTRACT

Multi-chip module systems and method of fabrication thereof wherein the equivalent of a failed die of a multi-chip module (MCM) is added to the module in a vacancy position previously constructed with appropriate electrical connections. A variety of different dice may be attached to the same vacancy position of an MCM by means of adapters, wherein each adapter has the same footprint, but different adapters are capable of accommodating different numbers and types of dice.

40 Claims, 2 Drawing Sheets

MULTI-CHIP MODULE SYSTEM AND METHOD OF FABRICATION

BACKGROUND OF THE INVENTION

Field of the Invention: This invention relates generally to multi-chip module systems and their method of fabrication. More specifically, the present invention relates to multi-chip module systems and their method of fabrication using known-good-die (KGD) therein.

State of the Art: An integrated circuit (IC) typically includes a semiconductor die (die) electrically attached to a leadframe, which provides physical support for the die and is used to connect the die with external circuitry located on a substrate. In such an arrangement, the leadframe and die are typically connected by means of wires, such as gold, aluminum, etc., being encapsulated within a plastic package, although ceramic and metal packages may also be used depending on the operating environment and the packaging requirements of the die.

With ever increasing demands for miniaturization and higher operating speeds, multi-chip module systems (MCM's) are increasingly attractive in a variety of electronics. MCM's which contain more than one die can help minimize the system operational speed restrictions imposed by long printed circuit board connection traces by combining, for example, the processor, memory, and associated logic into a single package. In addition, MCM's offer packaging efficiency.

Generally, MCM's may be designed to include more than one type of die within a single package, or may include multiples of the same die, such as the single in-line memory module (SIMM) or single in-line package (SIP).

It is well known that semiconductor dies have an early failure rate, often referred to in reliability terms as infant mortality. As with all assemblies, this phenomenon is also present in MCM's. For example, an MCM composed of ten dice, each die having an individual reliability yield of 95%, would result in a first pass test yield of less than 60%, while an MCM composed of twenty dice, each die having an individual reliability yield of 95%, would produce a first pass test yield of less than 36%. The market's perception of this phenomenon affects the decision to use MCM's in various applications.

Previously, an unacceptable die in an MCM, which has been subjected to burn-in and testing, has required either the replacement of such a die or the discard of the MCM. Both being time consuming and expensive. Additionally, since replacing an unacceptable die on an MCM poses risks to other MCM components during the replacement operation, it may be desirable to discard an MCM with such a die, rather than attempt rework the MCM, particularly where the reliability of the replacement die is not known.

Depending on the extent of testing and/or burn-in procedures employed, a die may typically be classified into varying levels of reliability and quality. For example, a die may meet only minimal quality standards by undergoing standard probe testing or ground testing while all still in wafer form, while individual separated die may be subjected to tests at full-range temperatures with full burn-in being subsequently termed a known-good-die (KGD).

A cost-effective method for producing known reliable MCM's is desirable for industry acceptance and use of MCM's in various applications. In an attempt to provide known reliable MCM's complying with consumer requirements, it is desirable either to fabricate an MCM of KGD or to fabricate an MCM of probe tested dice and subsequently subject the MCM to burn-in and performance testing. However, using only KGD in an MCM may not be cost effective since each KGD has been subjected to performance and burn-in testing, which are costly. In contrast to the use of all KGD in an MCM, when using die with well known production and reliability histories, particularly where the die being used is known to have a low infant mortality rate, the use of such minimally tested die to produce an MCM may be the most cost effective alternative.

As previously stated, since typical testing and burn-in procedures are generally labor and time intensive, posing significant risks to the dice of all MCM, in an instance where an MCM is produced from minimally tested die and in the event that the MCM contains an unacceptable die, replacement of unacceptable die with a KGD is preferable in the rework of the MCM because rework with KGD should not require the MCM to be subjected to further burn-in, but rather, only performance testing.

An example of a multi-chip module having a plurality of dynamic random access memory devices (DRAM's) used as memory in a computer is illustrated in U.S. Pat. No. 4,992,850, issued Feb. 12, 1991, to Corbett et al., assigned to the assignee of the present invention.

An example of a method and apparatus for the testing and burn-in of an individual die prior to packaging is illustrated in U.S. Pat. No. 5,424,652, issued Jun. 13, 1995, to Hembree et al., assigned to the assignee of the present invention. Such a method and apparatus provide a source of KGD to allow for the rework of an unacceptable die in an MCM with a KGD.

Other examples of a method for the testing and burn-in of an individual die prior to packaging are illustrated in U.S. Pat. Nos. 5,448,165 and 5,475,317.

In other instances, it is known to test a die in a package for functionality and replace any defective die. Such is illustrated in U.S. Pat. Nos. 5,137,836, 5,378,981, and 5,468,655.

In yet another instance, as illustrated in U.S. Pat. Nos. 5,239,747 and 5,461,544, it is known to test a multi-chip module (SIMM) to determine if any of the semiconductor devices mounted thereon are non-functional and, if so, replace the defective device with a device which has either been subjected to burn-in, or the entire multi-chip module can be subjected to another burn-in process after the replacement of the defective device. However, the defective devices are merely replaced by removing the defective device and replacing it with another, either a device subjected to burn-in or not. This process can be complicated, time consuming and costly, depending upon the type of device, the type of mounting of the device on the substrate, and the type of substrate used for mounting.

Therefore, a need exists for the cost-efficient fabrication of MCM's of known performance and reliability requirements.

SUMMARY

The present invention relates to known reliable multi-chip module systems and their method of fabrication. The present invention relates to multi-chip module systems and their method of fabrication using known-good-die (KGD) therein. In one embodiment of the present invention, a multi-chip module system is fabricated from probe tested die, burned-in, and if a die requires replacement after burn-in of the multi-chip module system, a known-good-die is used for replacement of the failed die. In another embodiment of the present invention, the multi-chip module system and the method of fabrication thereof includes a module having the capacity to accommodate at least two semiconductor dice, the module accommodating at least one more die than is desired to meet the module's intended function and performance parameters. Accordingly, the multi-chip module of the present invention includes at least one die and at least one vacant position capable of accommodating one or more additional dice where an acceptable die may be located in the module if it is determined that an unacceptable die is present from the testing and/or burn-in of the multi-chip module system.

BRIEF DESCRIPTION OF THE DRAWINGS

The features and advantages of the present invention can be more readily understood with reference to the following description and appended claims when taken in conjunction with the accompanying drawings wherein:

DETAILED DESCRIPTION OF THE ILLUSTRATED EMBODIMENTS

Figure 1:
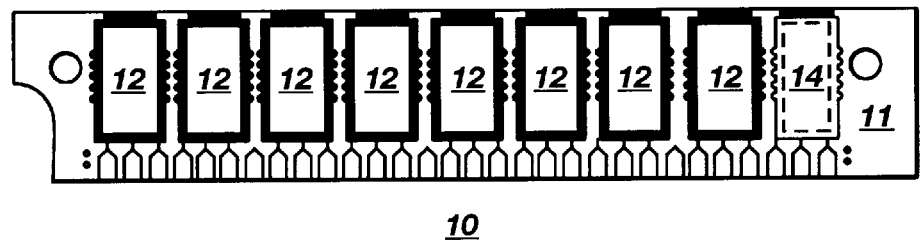
FIG. 1 is a top view of one embodiment of a SIMM type MCM in accordance with the present invention.

In accordance with the method of the present invention, a multi-chip module system (MCM) having at least one die attached thereto is subjected to burn-in procedures and performance testing to identify whether any die or dice of the MCM is unacceptable, such procedures being well known in the art.

In the event that one or more dice is unacceptable, a known-good-die (KGD) compatible with the unacceptable die is added to the MCM by positioning the KGD into a vacant position on the MCM, which position is configured to accept such a die as the unacceptable die. Likewise, where an MCM contains more than one unacceptable die, an equal number of KGD's may be added into vacant positions on the MCM, which positions have been configured to accept such dice as the unacceptable dice. It is to be understood, however, that fewer KGD's may be added than there are unacceptable dice where the combined effect of the KGD added to the MCM produces the same desired result. For example, where a ten-megabyte memory MCM having ten individual one-megabyte dice is determined to have two unacceptable dice, a single two-megabyte die may be added to the MCM for an equivalent overall result of ten-megabytes of memory.

The method of the present invention is applicable to MCM's which contain only one type of die, as well as to MCM's which contain more than one type of die. In the situation where an MCM contains only one type of die (e.g., SIMM type or SIP type), one or more vacant positions are provided on the MCM to accommodate an additional die in the event the MCM fails to meet its pre-determined performance characteristics. The vacant position or positions are constructed with the necessary connections and traces in the event a KGD is later added to the MCM.

In one embodiment, a SIMM having ten individual dice, for example, would be constructed with eleven die positions, wherein the eleventh position would be left vacant. Although the eleventh position is initially left vacant, appropriate connections are provided in the SIMM in case a die is subsequently positioned in the vacant slot. In the event one die is found to be unacceptable, a KGD would be added to the eleventh position and, if possible, the unacceptable die and the associated circuitry on the SIMM disabled and left on the SIMM. Accordingly, the unacceptable die may not need to be removed and no further burn-in is required since the added die is a KGD, thereby saving considerable expense and time and avoiding damage or complications associated with any further burn-in of the SIMM after the replacement of the unacceptable die. The corrected SIMM, including both the unacceptable die and the added KGD, then only needs to be subjected to testing procedures to ensure proper functioning of the SIMM. However, such testing is inexpensive and not time consuming when compared to either burn-in procedures or burn-in and subsequent testing procedures. Alternatively, if the unacceptable die cannot be disabled and remain in the SIMM, the unacceptable die is removed from its location or merely disconnected while functionally leaving the die in its place and a KGD added in the vacant position in the SIMM as described hereinbefore.

Particularly in situations where an MCM contains more than one type of die, a variety of different vacant positions may be provided at appropriate positions on the MCM so as to maximize efficient use of space on the MCM. In addition, a variety of adapters may be used for attaching different types of dice to an MCM. Different adapters, each being positionable within the same vacant slot of an MCM, are capable of supporting different types of dice. In particular circumstances, more than one type of die may be supported by a single adapter. In one embodiment, the adapter may also serve as a testing substrate, thereby facilitating individual die burn-in, wherein the die is attached to the adapter prior to burn-in.

As will be seen from the description of the present invention described hereinbelow, the method of the present invention facilitates the fabrication of known reliability multi-chip modules (MCM) and reduces the time and costs associated with the fabrication thereof.

Referring to the FIG. 1 of the drawings, a SIMM type MCM 10 in accordance with the present invention is shown. The SIMM 10 has eight dice 12 of the same type mounted on a suitable substrate 11. Although the SIMM 10 requires eight dice 12 to meet its design requirements, a ninth die position 14 is produced on substrate 11 of the SIMM 10 with suitable connections (not shown). The SIMM 10, having eight dice 12 and one vacant position 14, is subjected to suitable predetermined testing and burn-in procedures to ensure conformance with desired predetermined performance characteristics.

Figure 2:
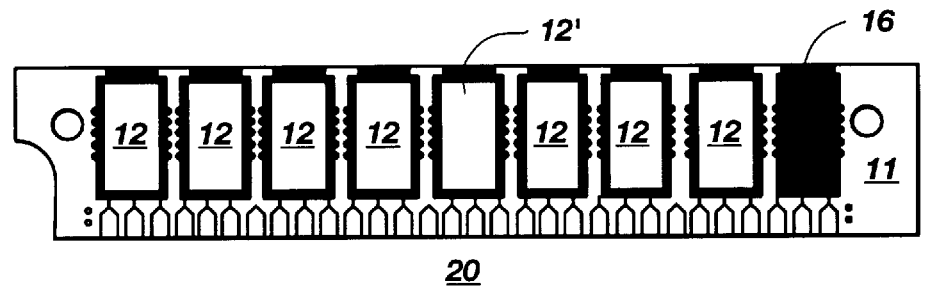
FIG. 2 is a top view of the corrected SIMM of FIG. 1, illustrating the addition of a KGD.

Referring to FIG. 2 of the drawings, in the event the SIMM 10 fails to meet its pre-determined performance characteristics, if possible, the identified unacceptable die 12', determined through procedures well known in the art, is not reworked, but is instead left in its respective position on the SIMM 10 with the die and its associated circuitry on the SIMM being disabled. As shown, an individual KGD die 16, determined through procedures well known in the art, is added to the substrate 11 of SIMM 10 in the vacant position 14. The resulting corrected SIMM 20, after being subject to appropriate testing to verify its performance characteristics, is then known to be a reliable MCM without requiring additional burn-in. Alternatively, if the unacceptable die 12' may not remain in the SIMM 10, it is removed and a KGD is added to the substrate 11 of the SIMM 10 in the vacant position 14 as described hereinbefore.

It is to be understood that in the event two dice of the SIMM have been found to be unacceptable, a single KGD 16, having twice the memory of each of the individual dice 12, may be installed in the vacant position 14. An MCM having more than two failed dice can likewise be corrected in the same manner. In alternative embodiments, particularly where size and space limitations are not critical, more than one vacant position 14 may be produced on the SIMM 10, whereby the number of unacceptable dice 12' may be replaced by an equivalent number of KGD's 16.

Figure 3:
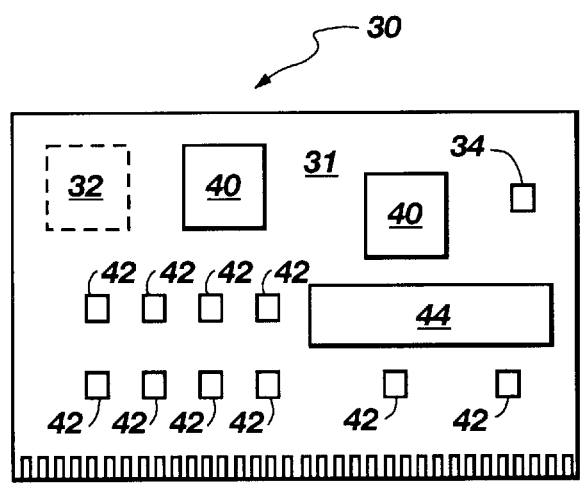
FIG. 3 is a top view of one embodiment of an MCM illustrating different types of dice and two different vacant die positions.

Referring to FIG. 3, a first MCM 30 having more than one type of die is shown. In one embodiment, two different vacant positions 32 and 34 are produced on the substrate 31 of the first MCM 30, each capable of accommodating different types of dice. Suitable electrical connections are provided to the vacant positions 32 and 34 on the substrate 31 in the event a die is to be subsequently added to either of the vacant positions 32 or 34. The first MCM 30 of FIG. 3 is designed with three different types of dice 40, 42, and 44. In the event that die 40 is unacceptable, an equivalent KGD (not shown) may be added to the vacant position 32. Likewise, in the event that die 42 is unacceptable, an equivalent KGD may be added to the vacant position 34. In this particular example, an equivalent of die 44, if determined to be unacceptable, is generally not possible due perhaps to the relatively large size of the die 44 and the fact that there is only one die 44 on the first MCM 30. However, under certain circumstances, the first MCM 30, having an unacceptable die 44, may be corrected by adding a combination of KGD's equivalent to dice 40 and 42 in vacant positions 32 and 34, respectively. An alternative vacant position (not shown) may be provided to accommodate a KGD equivalent of die 44. Additionally, the vacant positions 32 and 34 may be located on opposite sides of the substrate 31 of the MCM 30, if desired.

It is to be understood that any appropriate number of vacant positions 32 and 34 may be provided on the substrate 31 of the first MCM 30. In alternative embodiments, at least one vacant position is provided for each type of die utilized on an MCM. In another embodiment of the invention, the vacant position 32 is positioned within the region defined by the larger vacant position 34. More than one such "double vacancy" position may be produced on a single MCM.

Figure 4:
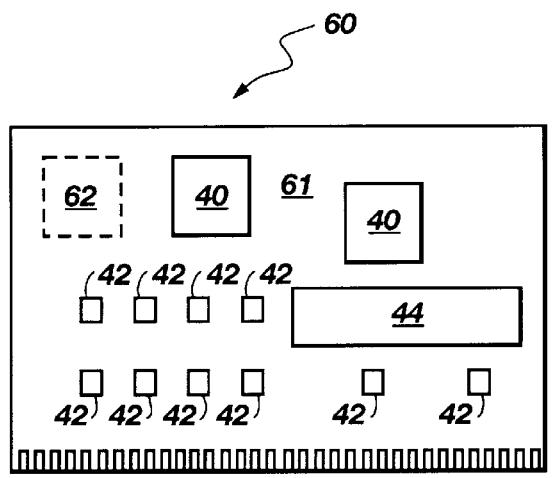
FIG. 4 is a top view of an alternative embodiment of the MCM of FIG. 3, having a single vacant die position for the accommodation of a die adapter.
Figure 5:
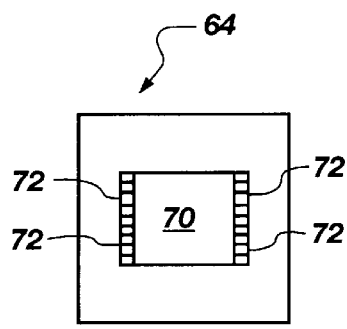
FIG. 5 is a top view of one embodiment of a semiconductor die adapter in accordance with the present invention.
Figure 6:
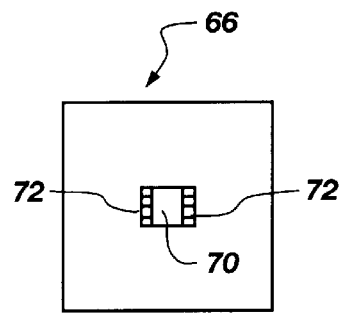
FIG. 6 is a top view of an alternative embodiment of a semiconductor die adapter.

Referring to FIG. 4, an alternative embodiment of the first MCM 30 is shown generally at 60. The second MCM 60 is designed to meet the same consumer operational and performance requirements as those of the first MCM 30 and contains the same number and types of dice 40, 42, and 44. However, the substrate 61 of the second MCM 60 contains an adapter vacancy 62. The adapter vacancy 62 is designed to accommodate a first adapter 64 or a second adapter 66, as shown in FIGS. 5 and 6, respectively. The first adapter 64 is designed to accommodate an equivalent of the individual die 40, while the second adapter 66 is designed to accommodate an equivalent of the individual die 42. The adapters have the same footprints, thereby being positionable within the same type of slots, and utilize the electrical connections of the substrate 61 of the second MCM 60, while allowing for the accommodation of different types of dice. The use of one type of adapter in accordance with the present invention is described in co-pending application for Flip Chip Adapter Package for Bare Die, Ser. No. 08/574,662, filed Dec. 19, 1995, which is hereby incorporated herein by reference.

Referring to FIG. 5, the adapter 64 includes a die slot 70 and electrical connectors 72. Different adapters may contain different electrical connections. In one embodiment, a single adapter is capable of accommodating two different types of dice, and the orientation of the adapter onto the MCM is determined by the type of die utilized with the adapter, so as to utilize the appropriate electrical connections of the MCM. For example, an adapter accommodating one type of die is positioned on an MCM at one orientation, while another adapter accommodating a different type of die may be positioned on the MCM at an orientation rotated 90° with respect to the adapter accommodating the first type of die.

Figure 7:
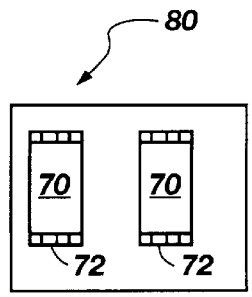
FIG. 7 is a top view of another alternative embodiment of a semiconductor die adapter illustrating the accommodation of multiple dice.

In accordance with the present invention, a second MCM 60 having an unacceptable die 40 or 42 may be corrected by adding the appropriate adapter 64 or 66 to the adapter vacancy 62 of the substrate 61. In alternative embodiments, a multiple adapter 80, as shown in FIG. 7, may accommodate more than one die including different types and sizes of die.

In one embodiment, the adapter to be positioned within the adapter vacancy 62 is used as a substrate for the testing and burn-in of an individual die. Accordingly, an unacceptable individual die and its corresponding adapter are dispensed with relatively inexpensively, while a KGD previously attached to an adapter is ready to be added to the adapter vacancy of an MCM.

As previously stated, one vacant position on a substrate can be positioned within the region defined by the position accommodating different die types and size while consuming a minimum of space on the adapter.

Characteristics of the described and illustrated embodiments are intended for illustrative purposes, and are not to be considered limiting or restrictive. It is to be understood that various adaptations and modifications may be made to the embodiments illustrated herein without departing from the spirit and scope of the invention, as defined by the following claims and equivalents thereof.

What is claimed is:

1. A method of manufacturing a multi-chip module system, said method comprising the steps of:

forming a substrate for use in said multi-chip module system, the substrate having at least a first position having, in turn, a predetermined configuration for locating a first semiconductor device thereat and having at least one other vacant position having, in turn, a predetermined configuration for locating a second semiconductor device thereat on the substrate;

installing a first semiconductor device in the first position of the substrate for use in said multi-chip module system;

determining if the multi-chip module system contains at least one unacceptable semiconductor device thereon; and repairing the substrate for use in a multi-chip module system to have an acceptable semiconductor device thereon by installing a second semiconductor device in the other vacant position in the substrate.

2. The method of claim 1, further comprising the step of:

installing a known-good-die in the other vacant position on the substrate for use in a multi-chip module system.

3. The method of claim 1, further comprising the step of:

testing said multi-chip module system to ensure compliance with pre-determined operational characteristics for the second semiconductor device.

4. The method as defined in claim 1, further comprising the step of:

repairing the substrate for use in a multi-chip module system to have an acceptable semiconductor device thereon by installing a second semiconductor device having an adapter attached thereto, the adapter having a predetermined configuration to be operably installed in the other vacant position in the substrate.

5. The method of claim 4, further comprising the step of:

installing a known-good-die having an adapter attached thereto, the adapter having a predetermined configuration to be operably installed in the other vacant position in the substrate for use in a multi-chip module system as the second semiconductor device.

6. The method as defined in claim 5, further comprising the step of:

testing said multi-chip module system to ensure compliance with pre-determined operational characteristics for the second semiconductor device.

7. A method of manufacturing a multi-chip module system, said method comprising the steps of:

forming a substrate for use in said multi-chip module system, the substrate having at least a first position having, in turn, a predetermined configuration for locating a first semiconductor device thereat and having at least one other vacant position having, in turn, a predetermined configuration for locating a second semiconductor device thereat on the substrate;

installing a first semiconductor device in the first position of the substrate for use in said multi-chip module system;

determining if the multi-chip module system contains at least one unacceptable semiconductor device thereon;

repairing the substrate for use in a multi-chip module system to have an acceptable semiconductor device thereon by installing a second semiconductor device in the other vacant position in the substrate, the second semiconductor device comprising a known-good-die.

8. The method of claim 7, further comprising the step of:

testing said multi-chip module system to ensure compliance with pre-determined operational characteristics for the second semiconductor device.

9. A method of manufacturing a multi-chip module system, said method comprising the steps of: forming a substrate for use in said multi-chip module system, the substrate having at least a first position having, in turn, a predetermined configuration for locating a first semiconductor device thereat and having at least one other vacant position having, in turn, a predetermined configuration for locating a second semiconductor device thereat on the substrate;

installing a first semiconductor device in the first position of the substrate for use in said multi-chip module system;

determining if the multi-chip module system contains at least one unacceptable semiconductor device thereon; and repairing the substrate for use in a multi-chip module system to have an acceptable semiconductor device thereon by installing a second semiconductor device having an adapter attached thereto, the adapter having a predetermined configuration to be operable installed in the other vacant position in the substrate.

10. The method of claim 9, further comprising the step of:

installing a known-good-die having an adapter attached thereto, the adapter having a predetermined configuration to be operably installed in the other vacant position in the substrate for use in a multi-chip module system as the second semiconductor device.

11. The method as defined in claim 10, further comprising the step of:

testing said multi-chip module system to ensure compliance with pre-determined operational characteristics for the second semiconductor device.

12. A method of manufacturing a multi-chip module system, said method comprising the steps of:

forming a substrate for use in said multi-chip module system, the substrate having at least first and second positions thereon, the first and second positions each having, in turn, a predetermined configuration for location a first and second semiconductor device thereat, and having at least one other vacant position having, in turn, a predetermined configuration for locating a third semiconductor device thereat on the substrate;

installing a first and second semiconductor device in the respective first and second positions of the substrate for use in said multi-chip module system, the first and second semiconductor devices each having a predetermined performance capability;

determining if the multi-chip module system contains at least one unacceptable semiconductor device thereon;

disabling the circuitry connected to the unacceptable semiconductor device; and repairing the substrate for use in a multi-chip module system to have an acceptable semiconductor device thereon by installing a third semiconductor device in the one other vacant position in the substrate, wherein the third semiconductor device installed in the one other vacant position is operable installed therein, the third semiconductor device having a predetermined performance capability.

13. The method of claim 12, further comprising the step of:

removing the unacceptable semiconductor device from the substrate.

14. A method of manufacturing a multi-chip module system, said method comprising the steps of:

forming a substrate for use in said multi-chip module system, the substrate having at least first and second positions thereon, the first and second positions each having, in turn, a predetermined configuration for location a first and second semiconductor device thereat, and having at least one other vacant position having, in turn, a predetermined configuration for locating a third semiconductor device thereat on the substrate;

installing a first and second semiconductor device in the respective first and second positions of the substrate for use in said multi-chip module system, the first and second semiconductor devices each having a predetermined performance capability;

determining if the multi-chip module system contains at least one unacceptable semiconductor device thereon;

disabling the circuitry connected to the unacceptable semiconductor device; and repairing the substrate for use in a multi-chip module system to have an acceptable semiconductor device thereon by installing a third semiconductor device in the one other vacant position in the substrate, wherein the third semiconductor device installed in the one other vacant position is operable installed therein, the third semiconductor device having a predetermined performance capability, wherein the third semiconductor device comprises a known-good-die as the third semiconductor device in the other vacant position on the substrate for use in a multi-chip module system, the known-good-die having a predetermined performance capability.

15. The method of claim 12, further comprising the step of:

testing said multi-chip module system to ensure compliance with pre-determined performance capability for the third semiconductor device.

16. The method of claim 12, further comprising the step of:

repairing the substrate for use in a multi-chip module system to have an acceptable semiconductor device thereon by installing a third semiconductor device in the at least in the substrate, wherein the third semiconductor device installed in the at least is operably installed therein, the third semiconductor device installed in the at least having a predetermined performance capability of the combined predetermined performance capability of the first and the second semiconductor devices.

17. A method of manufacturing a multi-chip module system, said method comprising the steps of:

forming a substrate for use in said multi-chip module system, the substrate having at least first and second positions thereon, the first and second positions each having, in turn, a predetermined configuration for location a first and second semiconductor device thereat, and having at least one other vacant position having, in turn, a predetermined configuration for locating a third semiconductor device thereat on the substrate;

installing a first and second semiconductor device in the respective first and second positions of the substrate for use in said multi-chip module system, the first and second semiconductor devices each having a predetermined performance capability;

determining if the multi-chip module system contains at least one unacceptable semiconductor device thereon;

disabling the circuitry connected to the unacceptable semiconductor device; and repairing the substrate for use in a multi-chip module system to have an acceptable, semiconductor device thereon by installing a third semiconductor device having an adapter attached thereto, the adapter having a predetermined configuration to be operably installed in the other vacant position in the substrate.

18. The method of claim 17, further comprising the step of:

installing a known-good-die as a third semiconductor device having an adapter attached thereto, the adapter having a predetermined configuration to be operably at least one other vacant position in the substrate for use in a multi-chip module system as the third semiconductor device.

19. The method as defined in claim 18, further comprising the step of:

testing said multi-chip module system to ensure compliance of the third semiconductor device with the pre-determined performance capability for the third semiconductor device.

20. The method of claim 12, further comprising the step of:

forming a substrate for use in said multi-chip module system, the substrate having at least a first position having a first mounting configuration for a semiconductor device thereat, having a second position having a second mounting configuration for a semiconductor device thereat different than the first mounting configuration, and having at least one other vacant position having, in turn, a predetermined configuration for locating a third semiconductor device thereat on the multi-chip module system.

21. The method of claim 20, further comprising the step of:

configuring one other vacant position located on the substrate to have a predetermined semiconductor mounting configuration which corresponds to the first mounting configuration of the first semiconductor device and which corresponds to the second mounting configuration of the second semiconductor device.

22. The method of claim 21, further comprising the step of:

configuring the location of the one other vacant position located on the substrate such that on one side of the substrate the one other vacant position has a predetermined semiconductor mounting configuration which corresponds to the first mounting configuration of the first semiconductor device; and forming on the other side of substrate a second vacant position that has a predetermined configuration which corresponds to the second mounting configuration of the second semicondutor device.

23. A method of manufacturing a multi-chip module system, said method comprising the steps of:

forming a substrate for use in said multi-chip module system, the substrate having at least a first position having a predetermined first mounting configuration for a semiconductor device thereat, having a second position having a predetermined second mounting configuration for a semiconductor device thereat different than the first mounting configuration, and having at least one other vacant position having, in turn, a predetermined third configuration for location a third semiconductor device thereat on the multi-chip module system;

installing a first semiconductor device in the first position of the substrate for use in said multi-chip module system; and determining if the multi-chip module system contains at least one unacceptable semiconductor device thereon;

disabling the circuitry connected to the unacceptable semiconductor device; and repairing the substrate for use in a multi-chip module system to have an acceptable semiconductor device thereon by installing a second semiconductor device in the other vacant position in the substrate.

24. The method of claim 23, further comprising the step of:

wherein the third semiconductor device includes a known-good-die in the other vacant position on the substrate for use in a multi-chip module system. configuration of the second semiconductor device.

25. The method as defined in claim 23, further comprising the step of:

configuring the at least one other vacant position located on the substrate to have a predetermined semiconductor mounting configuration which corresponds to the first mounting configuration of the first semiconductor device and which corresponds to the second mounting configuration of the second semiconductor device.

26. The method of claims 23, further comprising the step of:

removing the unacceptable semiconductor device from the substrate.

27. The method of claim 25, further comprising the step of:

configuring the location of the at least one other vacant position located on the substrate such that on one side of the substrate the at least one other vacant position has a predetermined semiconductor mounting configuration which corresponds to the first mounting configuration of the first semiconductor device; and forming on the other side of the substrate a second vacant position that has a predetermined configuration which corresponds to the second mounting configuration of the second semiconductor device.

28. The method of claim 23, further comprising the step of:

installing a third semiconductor chip in the at least one other vacant location, the third semiconductor chip having a predetermined mounting configuration which corresponds to the first mounting configuration of the first semiconductor device.

29. The method of claim 23, further comprising the step of:

installing a third semiconductor chip in the at least one other vacant location, the third semiconductor chip having a predetermined mounting configuration which corresponds to the second mounting configuration of the second semiconductor device.

30. The method of claim 27, further comprising the step of:

installing a third semiconductor chip in the at least one other vacant location on one side of the substrate, the third semiconductor chip having a predetermined mounting configuration which corresponds to the first mounting configuration of the first semiconductor device.

31. The method of claim 27, further comprising the step of:

installing a third semiconductor chip in the second vacant location on the other side of the substrate, the third semiconductor chip having a predetermined mounting configuration which corresponds to the second mounting configuration of the second semiconductor device.

32. The method of claim 31, further comprising the step of:

disabling the circuitry connected to the unacceptable semiconductor device.

33. The method of claim 31, further comprising the step of:

removing the unacceptable semiconductor device from the substrate.

34. A method of manufacturing a multi-chip module system, said method comprising the steps of:

forming a substrate for use in said multi-chip module system, the substrate having at least a first position having a first predetermined mounting configuration for a semiconductor device thereat, having a second position having a second predetermined mounting configuration for a semiconductor device thereat different than the first mounting configuration, having at least a first vacant position having, in turn, a third predetermined configuration for locating a third semiconductor device thereat on the substrate, and having a second vacant position having, in turn, a fourth predetermined configuration for locating a fourth semiconductor device thereat on the substrate;

installing a first semiconductor device in the first position of the substrate for use in said multi-chip module system, the first semiconductor device having a first performance capability;

installing a second semiconductor device in the second position of the substrate for use in said multi-chip module system, the second semiconductor device having a second performance capability; and determining if the multi-chip module contains at least one unacceptable semiconductor device thereon;

determining if the unacceptable semiconductor device is the first semiconductor device;

configuring the first vacant position located on the substrate to have a third predetermined semiconductor mounting configuration which corresponds to the first predetermined mounting configuration of the first semiconductor device;

configuring the second vacant position located on the substrate to have a forth predetermined semiconductor configuration which corresponds to the second predetermined mounting configuration of the second semiconductor device; and installing a third semiconductor device having the performance capability of the unacceptable semiconductor device in one of the first vacant position or the second vacant position.

35. The method of claim 34, further comprising the step of:

configuring the location of the first vacant position to be located on the substrate on one side thereof such that one side of the substrate has the first vacant position thereon having a third predetermined semiconductor mounting configuration which corresponds to the first predetermined mounting configuration of the first semiconductor device; and configuring the location of the second vacant position to be located on the other side of the substrate such that the second the second vacant position has a fourth predetermined configuration which corresponds to the second predetermined mounting configuration of the second semiconductor device.

36. The method of claim 34, further comprising the step of:

installing a third semiconductor device having the performance capability of the first semiconductor device if the first semiconductor device is determined to be unacceptable.

37. The method of claim 34, further comprising the step of:

determining if the unacceptable semiconductor device is the second semiconductor device.

38. The method of claim 37, further comprising the step of:

installing a fourth semiconductor device having the performance capability of the second semiconductor device if the second semiconductor device is determined to be unacceptable.

39. The method of claim 34, further comprising the step of:

removing the unacceptable semiconductor device from the substrate.

40. The method of claim 34, further comprising the step of:

disabling the circuitry connected to the unacceptable semiconductor device.

* * * * *

UNITED STATES PATENT AND TRADEMARK OFFICE
CERTIFICATE OF CORRECTION

PATENT NO : 5,807,762
DATED : Sep. 15, 1998
INVENTOR(S) : Akram et al.

It is certified that error appears in the above-identified patent and that said Letters Patent is hereby corrected as shown below:

In Column 9, line 21, after "the at least", insert --one other vacant position--.

In Column 9, line 22, after "the at least", insert --one other vacant position--.

In Column 9, line 24, after "the at least", insert --one other vacant position--.

In Column 9, line 58, after "operably", insert --installed in the--.

In Column 10, line 61, after "in the", insert --at least one--.

In Column 10, line 62 and 63, after "system." delete "configuration of the second semiconductor device."

In Column 12, line 46, delete the first occurrence of "the second".

Signed and Sealed this

Eighteenth Day of May, 1999

*Attest:*

Q. TODD DICKINSON

*Attesting Officer*  Acting Commissioner of Patents and Trademarks